United States Patent [19]

Kersch et al.

[11] Patent Number: 4,506,108

[45] Date of Patent: Mar. 19, 1985

[54] COPPER BODY POWER HYBRID PACKAGE AND METHOD OF MANUFACTURE

[75] Inventors: Dennis R. Kersch; Don E. Mitchell, both of Phoenix, Ariz.

[73] Assignee: Sperry Corporation, New York, N.Y.

[21] Appl. No.: 481,128

[22] Filed: Apr. 1, 1983

[51] Int. Cl.³ .............................................. H05K 5/04
[52] U.S. Cl. ........................... 174/52 FP; 29/588; 219/121 ED; 219/121 LD; 357/74; 357/75
[58] Field of Search ............... 174/52 FP; 357/74, 75; 29/588; 219/121 EC, 121 ED, 121 LC, 121 LD

[56] References Cited

U.S. PATENT DOCUMENTS

| | | | |
|---|---|---|---|
| 3,176,382 | 4/1965 | Dickson, Jr. et al. | 29/588 |
| 4,266,089 | 5/1981 | Scherer | 174/52 FP |
| 4,400,870 | 8/1983 | Islam | 29/588 |

*Primary Examiner*—A. T. Grimley
*Assistant Examiner*—D. A. Tone
*Attorney, Agent, or Firm*—Howard P. Terry

[57] ABSTRACT

A hybrid microcircuit package especially for high power microcircuits comprises a hard copper base with integral packaged sidewalls, a sealing frame of Kovar or stainless steel is electron beam welded or laser welded to the top surface of said sidewalls, whereby to highly localize the high temperature at the wall tops and not anneal to the remainder of the copper base. A Kovar or stainless steel lid is conventionally sealed to the frame.

13 Claims, 1 Drawing Figure

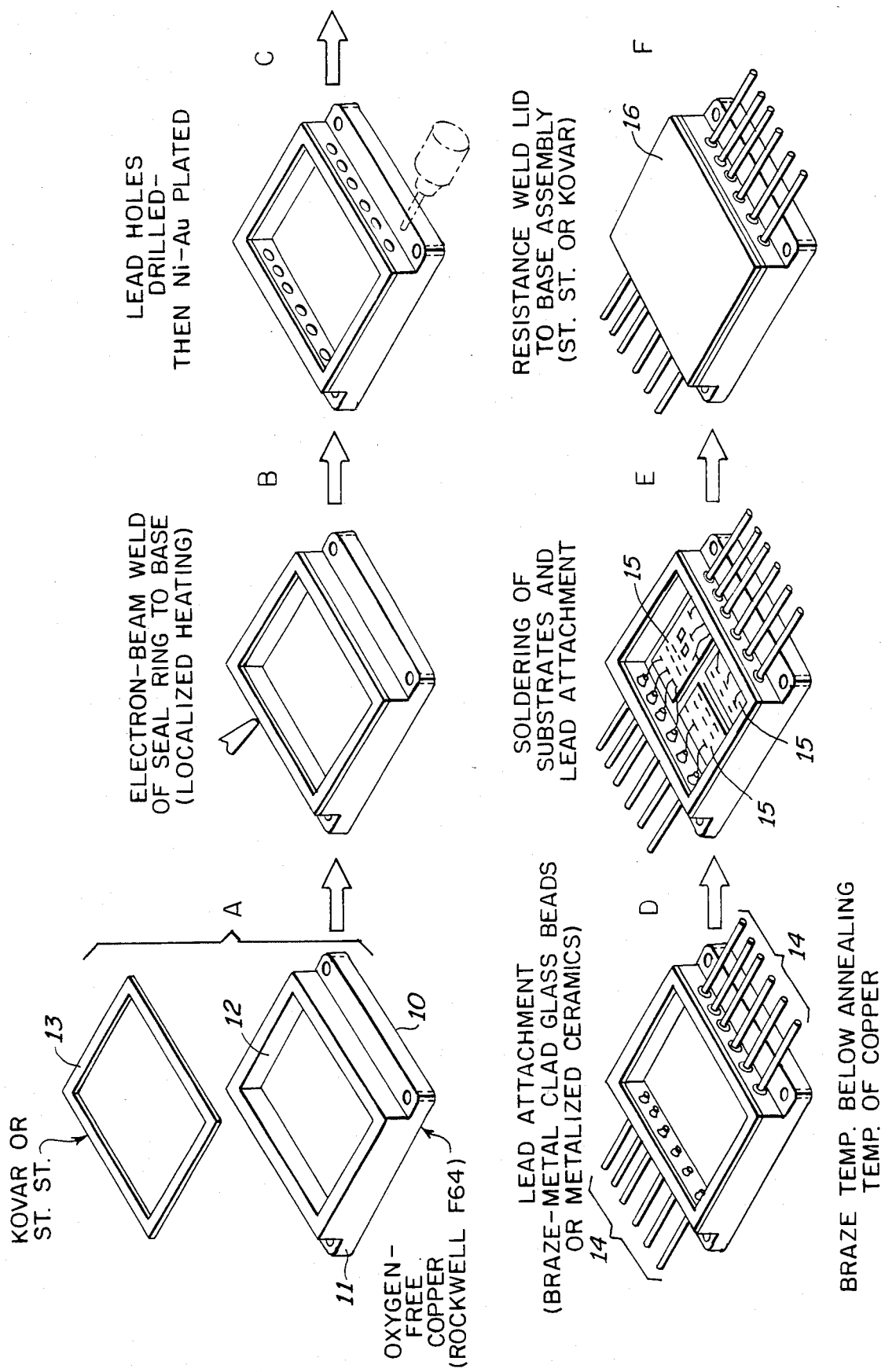

COPPER BODY POWER HYBRID PACKAGE AND METHOD OF MANUFACTURE

BACKGROUND OF THE INVENTION

1. Field of the Invention

The present invention relates generally to the art of packaging microcircuits and particularly high power hybrid microcircuit packages. In this technology, several thin-film semiconductor devices are placed in one microcircuit package. The interconnects are accomplished by placing the semiconductor devices on ceramic substrates printed with thick-film or thin-film metallized tracks. Hence, this is a "hybrid" semiconductor containing several devices of both thick and thin-film technologies all contained in one microcircuit package. This invention specifically pertains to the hybrid package itself, particularly useful in packaging several high power semiconductor devices.

2. Description of the Prior Art

In the current art of building metal hybrid microcircuit packages, the most common metals being used are cold rolled steel, stainless steel, molybdenum, aluminum, copper, and Kovar (a very well-known iron-nickel-cobalt alloy). The most popular and technically advantageous metal to build a microcircuit package with is Kovar. The normal Kovar package is a box-shaped enclosure with a single piece side wall that is high-temperature brazed to the package bottom. Alternatively, the bottom and side wall are stamped from a single sheet or Kovar material. Holes are then drilled or punched into the bottom, e.g. in the familiar dual-in-line or plug-in configurations or in the side wall, e.g. in the flat pack or butterfly configuration. The leads, also most commonly made of Kovar, are glass-sealed into the package to complete the assembly. The glass serves both to insulate the leads from the body and to form a hermetic seal.

The typical application of this package is to epoxy or solder the ceramic substrate containing the semiconductor devices to the bottom of the package, wire the thick-film metal tracks to the leads, as required, and hermetically weld a Kovar lid to seal the package. This assembly, known as a hybrid microcircuit, can then be soldered onto a printed wiring board and used similar to any ordinary discrete microcircuit containing only a single semiconductor device. The advantage of a hybrid microcircuit is a decrease in weight and volume over the equivalent number of discrete devices. The main advantage of using Kovar for the package is that its coefficient of thermal expansion is similar to both the ceramic substrates and the glass seals. Consequently, the complete assembly expands and contracts at the same rate. No excessive thermal stresses, therefore, are developed in the assembly during temperature extremes of fabrication and environmental testing. Without thermally matching materials, damage from stresses occurs, such as cracks in substrates, glass seals, weld joints, braze joints resulting in loss of hermeticity. Hermeticity requirements, internal atmosphere requirements, and no loose internal particles are the main reason metal packages are chosen over ceramic or plastic type packages.

Of particular interest and advantage in using metal packages is that they can be sealed in a conventional seam sealing machine which ensures control over the internal atmosphere. A seam sealer consists of three internally connected chambers. The first (entrance) chamber is a vacuum bake oven where water, cleaning chemicals, and other contaminants are evaporated and drawn away from the parts. The center (welding) chamber, which is backfilled with dry nitrogen, contains the welding apparatus. The third (exit) chamber is a double door pass-through purged with dry nitrogen to prevent back streaming of air and water vapor into the welding chamber. The parts are passed directly from the vacuum bake chamber to the welding chamber. The lid and package are hermetically welded together (sealing in the dry nitrogen) by a series of overlapping spot welds. There are no loose internal particles created with this system as can occur when using a solder or epoxy. Also, there is no flux needed as with some solders which would contaminate the internal atmosphere. And finally, the joint is environmentally stronger than either soldering or epoxying on the lid.

The major disadvantage of Kovar, however, is that it has a low thermal conductivity. The use of Kovar microcircuit packages is, therefore, limited to the packaging of low power semiconductor devices. The maximum electrical power a Kovar package can dissipate is approximately one watt per square inch without overheating the semiconductor device and adversely affecting their electrical characteristics. Metals with higher thermal conductivity, like cold rolled steel, molybdenum, aluminum, and copper are, therefore, often used for hybrid microcircuit packaging of high power semiconductor devices. In some applications, copper is the only practical material with a high enough thermal conductivity to dissipate the heat generated by several high power semiconductor devices packed as densely as they typically are in a hybrid.

Use of copper in the prior art has, however, disadvantages which must be considered if it is used as a hybrid package material. First, its coefficient of thermal expansion is considerably different from the ceramic substrates and glass seals. An assembled hybrid microcircuit cannot be designed, therefore, which expands and contracts at the same rate, resulting in an assembly free from thermal stresses. Secondly, copper has an annealing temperature of 375° C. If processed above this temperature, as typically necessary in the prior art with high temperature brazing, copper will change from a relatively elastic to a plastic, or inelastic material. Like all plastic materials, any force which causes stresses in excess of the material's yield strength will cause a permanent physical deformation of the part. Such deformation causes cracked substrates and loss of hermeticity in the assembled device. In addition, annealed copper can only be strengthened by hardening through cold working the copper, which is not practical with a machined part. Beryllium can be added to the copper to make it hardenable by heat treating processes, but even adding a small amount of beryllium reduces its thermal conductivity which significantly reduces the advantages of the material. Finally, hermetically sealing a lid to a copper bodied package must be limited to a low temperature soldering or brazing process. Such a process requires care in selecting a material that either melts at a temperature low enough that does not damage other internal assemblies, or is localized enough to prevent exposure of the internal assemblies to excessive heating. Localized heating can be accomplished with specialized equipment, which may often be impractical or not available. Equipment for perimeter, or seam sealing equipment, typically is available, and can be used for soldering, but localized heating requires using a lid of low thermal conductivity, such as Kovar, to effect the contact resistance heating. This, of course, results in another thermal mismatch between the lid and copper body, which will stress the weaker solder alloy causing evenual hermeticity failures.

Three approaches have been followed in the past to overcome the problems of using copper as a microcircuit hybrid package material. The first is to machine the base including bottom and side walls out of copper. Lead assemblies are then low-temperature brazed (under 375° C.) into the package. A lead assembly consists of a lead, a metal shell, or eyelet, and a glass seal between the lead and shell. Lead assemblies are used when leads cannot be directly glass sealed into the side wall or bottom of a package due to thermal mismatch of materials or deleterious effects of the high temperature, e.g., annealing of copper. This copper package configuration has a major disadvantage of not having a suitable top surface for seam welding a lid in place to ensure a strong hermetic device without risk of internal contamination.

To overcome the disadvantage of the first approach, a second prior art approach is to low-temperature braze a side wall or seal ring of low thermal conductivity metal onto a copper bottom. A seal ring is a thin window frame shaped piece of metal which is attached to the top of a copper side wall to provide a low thermal conductivity welding surface. This configuration can, therefore, be sealed in a seam sealer and does have a high thermal conductivity package bottom to remove heat generated by internal components. The disadvantage, however, of this configuration is the low strength of the braze joint, which is necessarily a low temperature braze (less than 375° C.) to ensure the copper is not annealed and weakened. The difficulty with this approach is similar to that of the first approach in that the braze joint is between two very dissimilar materials whose thermal coefficient of expansion differences are enough to compromise the strength of the joint during thermal exposures.

The third prior approach is to high-temperature braze on a seal ring or side wall. This configuration can be sealed in a seam sealer and the braze joint is strong enough to withstand environmental testing. The disadvantage, however, of this configuration is that high temperature brazing is done well above the 375° C. annealing temperature of copper, which compromises its strength causing it to yield to the thermal mismatch of other materials used in the hybrid device assembly; i.e., ceramic substrates.

SUMMARY OF THE INVENTION

The high thermal conductivity copper-bodied hybrid microcircuit package of the present invention overcomes the prior problems of using copper as the package material. It is a package which can be assembled, seam sealed, and pass harsh environmental testing similar to a Kovar package, but yet dissimilar in that the thermal conductivity is much higher.

To accomplish this a low thermal conductivity metal (such as Kovar or stainless steel) seal ring is attached to the hard copper package base using the highly localized heating characteristics of electron beam or laser beam welding. The seal ring is thus hermetically sealed to the copper base without softening or annealing the base which would otherwise permit the base to deform or wrap during subsequent exposure to assembly, test and environmental temperature extremes.

BRIEF DESCRIPTION OF THE DRAWINGS

The FIGURE of the drawing in parts A-F illustrates the overall structure of the hybrid package of the present invention and the successive steps used in its assembly.

DETAILED DESCRIPTION OF THE INVENTION

The copper body power hybrid microcircuit package of this invention as shown in FIGS. 1A and 1D, consists of three main parts. The first part is a bottom, or base 10, in the present embodiment a combined bottom 11 and side wall 12 of metallurgically hard, elastic and typically oxygen free high conductivity copper. The second part is a seal ring 13 of a low thermal conductivity metal which can be welded, such as Kovar or stainless steel. The third part is a standard technology lead assembly 14 consisting of conventionally, a Kovar or Alloy 52 lead, glass sealed into a steel eyelet. An alternate standard technology lead assembly would be one consisting of a ceramic washer metallized on both the outside and inside diameter, into which a copper-cored Kovar, or Alloy 52 clad lead is brazed.

The package is assembled in such a manner that it is strong enough to remain hermetic and undeformed through assembly, testing and in use environmental exposure. As shown in FIG. 1A, the base 10 and seal ring 13 is conventionally machined to size. The seal ring 13 is then electron beam welded (EBW) to the base as shown in FIG. 1B. An alternate method would be to laser weld the two parts together. Both of these methods provide a strong welded fusion of the dissimilar metals without overheating and annealing of the copper base 10 due to the very localized heating characteristic of electron or laser beam welding.

After electron or laser beam welding, the final machining will be done. This machining includes drilling holes in the side walls 12, as shown in FIG. 1C, for acceptance of the lead assemblies 14. An alternate location for the leads would be to place them in the bottom of the package depending upon the desired package configuration. It should be noted that drilling the holes after electron beam welding the frame 13 minimizes annealing the copper by maximizing the amount of material present to transfer heat away from the weld area. The assembly as shown in FIG. 1C is then gold plated over a nickel underplating. The next step is to low-temperature braze the lead assemblies into the package, as shown in FIG. 1D, at a temperature (approximately 320° C.) below the annealing temperature of copper, but above that of any subsequent assembly or environmental temperatures, using an alloy such as 80 percent gold/20 percent tin.

The assembly as shown in FIG. 1D is now ready for attachment of the microcircuit substrates 15, of alumina or beryllia ceramic as shown in FIG. 1E which contains the high-power semiconductor devices. The normal method of attaching the substrates to the bottom of the package is to solder or alloy them into place to achieve the necessary high thermal conductivity path in operation. The resultant assembly acts as a bi-metallic strip which permits it to deform or bow and then return to its original normal position with each temperature cycle. It is important that this deformation be kept as small as possible. If this bowing is too great, the substrate will crack at extreme temperatures or the concavity of the package will cause an air gap between the package and the heat sink on which it is mounted. Such an air gap would increase the thermal resistance of the heat transfer path from the semiconductor device through the substrate, the solder or alloy, and the package bottom to the heat sink on to which the package is mounted. One skilled in analysis and using the copper package of this invention can readily determine the package bottom thickness, substrate thickness, solder thickness and substrate maximum length that will not excessively bow under thermal stress. The package will remain flat and in intimate contact with the heat sink and not crack relatively large area substrates of three-fourths of an inch or longer in length. It is important to note that the elastic modulus of the assembly be maintained to ensure adequate strength. This requires preventing exposure of the package in subsequent hybrid assembly operations and ultimate use in applications, to excessive temperatures which may anneal the copper.

The penultimate step in the assembly of the power hybrid microcircuit of the present invention is to wire bond the required interconnections between the substrate circuits and the leads 14 using conventional wire bonding tools. The resulting assembly is illustrated in FIG. 1E.

Finally, the package lid 16 is secured in place. Since the seal ring is fabricated from Kovar or stainless steel, the lid 16 which may also be fabricated from Kovar or stainless steel, may be resistance or overlapped spot welded to the seal ring 13 using a conventional seam sealer machine as described above.

While the invention has been described in its preferred embodiments, it is to be understood that the words which have been used are words of description rather than of limitation and that changes may be made within the purview of the appended claims without departing from the true scope and spirit of the invention in its broader aspects.

We claim:

1. A high power hybrid microcircuit package comprising
    (a) a base member having a bottom and upstanding side walls together defining an interior volume, said base member being fabricated from a metallurgically hard, elastic, high thermally conductive copper,
    (b) a seal ring on the top surface of said side walls, said seal ring having fabricated from a low thermal conductivity weldable metal, said seal ring being welded to said side wall tops by highly localized thermal weld whereby to avoid annealing of said hard copper base member,
    (c) a plurality of conductor leads extending through said side walls and having seal members brazed to said side walls, and
    (d) a top lid on said seal ring, said lid being fabricated from a low thermal conductivity metal and being resistance welded to said seal ring.

2. The hybrid microcircuit package as set forth in claim 1 wherein said hard copper has an annealing temperature on the order of 375° C.

3. The hybrid microcircuit package as set forth in claim 2 wherein said seal ring is fabricated from an iron-nickel-cobalt alloy.

4. The hybrid microcircuit package as set forth in claim 2 wherein said seal ring is fabricated from stainless steel.

5. The hybrid microcircuit package as set forth in claim 2 wherein said seal ring is electron beam welded to said side walls.

6. The hybrid microcircuit package as set forth in claim 2 wherein said seal ring is laser welded to said side walls.

7. The hybrid microcircuit package as set forth in claim 2 wherein said seal ring thermal weld occurs at temperatures in excess of about 375° C. but so localized to the copper adjacent said weld that the temperature of the remainder of said base member does not exceed 375° C.

8. The hybrid microcircuit package as set forth in claim 2 wherein said conductor leads are brazed to said sidewalls at temperatures below 375° C.

9. The hybrid microcircuit package as set forth in claim 2 wherein said lid is overlapping spot welded to said seal ring.

10. The method of manufacturing a high power hybrid microcircuit package consisting in
    welding a seal ring to the top walls of a metallurgically hard, elastic, high thermally conductive copper base member having upstanding sidewalls together defining an interior volume, said welding being accomplished such that the temperature of only the top edges of said sidewalls exceeds the annealing temperature of said copper whereby the temperature of the remainder of said sidewalls and said bottom does not exceed said annealing temperature.

11. The method as set forth in claim 10 further consisting in
    (a) drilling holes in said base member after said welding of said seal ring for accepting conductor leads in said base member electrically communicating with said interior volume,
    (b) gold plating said drilled base member, and then
    (c) brazing at a temperature below the annealing temperature of said copper said leads into said drilled holes.

12. The method as set forth in claim 11 further consisting in
    (a) brazing at a temperature below the annealing temperature of said copper at least one hybrid microcircuit substrate to said base member,
    (b) bonding interconnecting wire conductors between said microcircuit substrate and said leads, and then
    (c) seam sealing a metallic lid to said seal ring for hermetically sealing said interior volume, said seam sealing being accomplished such that the temperature of only the top edges of said sidewalls exceeds the annealing temperature of said copper.

13. The method as set forth in claim 12 wherein said seam sealing consists in overlapping spot welding.

* * * * *